United States Patent [19]
Fujita et al.

[11] Patent Number: 5,414,488
[45] Date of Patent: May 9, 1995

[54] IMAGE FORMING APPARATUS HAVING TEMPERATURE CONTROL FOR PHOTOSENSITIVE MEMBER

[75] Inventors: Toru Fujita; Kiyoharu Mimose; Takashi Suzuki, all of Suwa, Japan

[73] Assignees: Seiko Epson Corporation; Seiko Instruments Co., Ltd., both of Tokyo, Japan

[21] Appl. No.: 980,804

[22] PCT Filed: Jun. 22, 1992

[86] PCT No.: PCT/JP92/00797

§ 371 Date: Apr. 16, 1993

§ 102(e) Date: Apr. 16, 1993

[87] PCT Pub. No.: WO93/00613

PCT Pub. Date: Jan. 7, 1993

[30] Foreign Application Priority Data

Jun. 27, 1991 [JP] Japan ................................. 3-156425
Dec. 12, 1991 [JP] Japan ............................. 3-102547 U
Dec. 12, 1991 [JP] Japan ................................. 3-328895

[51] Int. Cl.6 ........................................... G03B 27/32
[52] U.S. Cl. ................................................ 355/30; 355/27
[58] Field of Search ................ 355/30, 215, 27; 346/107 R, 76 L; 250/317.1, 318, 319

[56] References Cited

U.S. PATENT DOCUMENTS

| | | | |
|---|---|---|---|
| 4,737,822 | 4/1988 | Taniguchi et al. | 355/27 |
| 4,760,426 | 7/1988 | Taniguchi et al. | 355/27 |
| 4,799,085 | 1/1989 | Nagumo et al. | 355/27 |
| 4,853,743 | 8/1989 | Nagumo et al. | 355/27 |
| 4,864,356 | 9/1989 | Asano et al. | 355/30 |
| 4,945,383 | 7/1990 | Kobayashi et al. | 355/30 |
| 4,978,968 | 12/1990 | Ishikawa et al. | 355/27 X |
| 5,028,954 | 7/1991 | Yamamoto et al. | 355/30 |
| 5,091,743 | 2/1992 | Nagata et al. | 355/30 |
| 5,128,709 | 7/1992 | Nagumo et al. | 355/27 |

FOREIGN PATENT DOCUMENTS

| | | |
|---|---|---|
| 62-147461 | 7/1987 | Japan . |
| 63-231345 | 9/1988 | Japan . |
| 1-106059 | 4/1989 | Japan . |
| 1-315740 | 12/1989 | Japan . |
| 2-050160 | 2/1990 | Japan . |
| 0208048 | 9/1991 | Japan . |

*Primary Examiner*—Robert B. Beatty
*Attorney, Agent, or Firm*—Eric B. Janofsky

[57] ABSTRACT

In an image formation apparatus utilizing a photosensitive heat developable member, an image formation apparatus has a specific process control characteristic extending from heat development to pressure transfer, so as to obtain stable image formation regardless of the environmental temperature or conditions of use for the device. Therefore, it is effective to detect temperature and humidity from heat development to pressure transfer, control the temperature of heat development, and heating time, or maintain a uniform temperature for the photosensitive member until pressure transfer occurs after heat development, and in particular, to cool the photosensitive member below a predetermined temperature. The method of cooling is carried out so as to 1) cool below the temperature of the pressure transfer plus 50° C., and 2) start to cool within 10 seconds after the completion of heat development. Further, an air cooling method such as one using a specific cooling mechanism, having a cooling roller (59, 74) and fans (60, 63, 72) is applicable. Otherwise, a water cooling method using a cooling roller (76) may also be used.

5 Claims, 10 Drawing Sheets

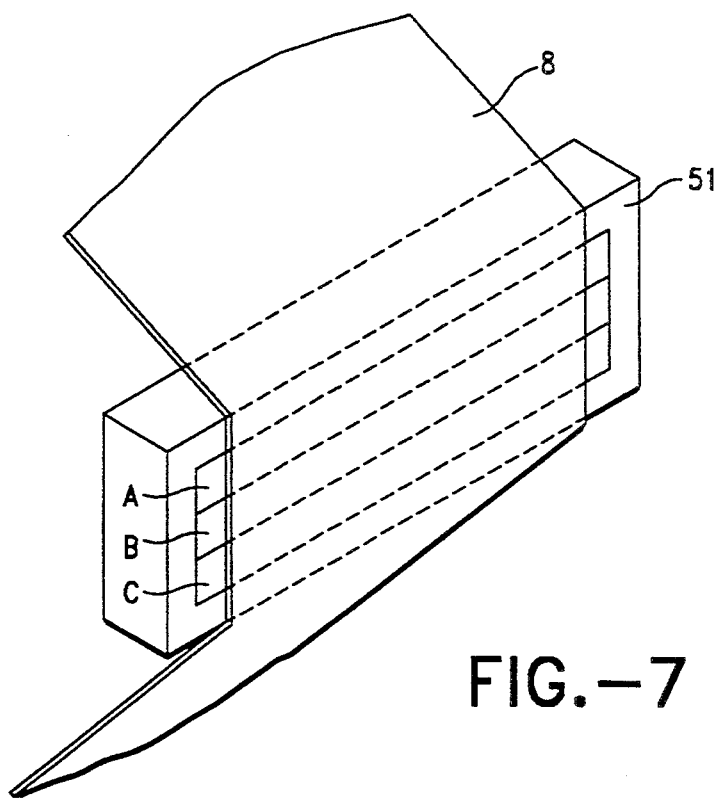
FIG.—7
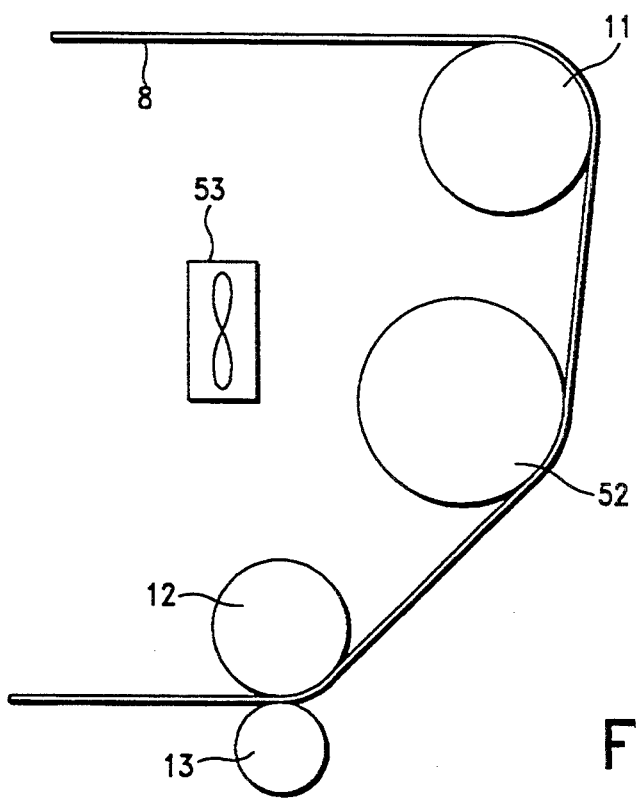
FIG.—8

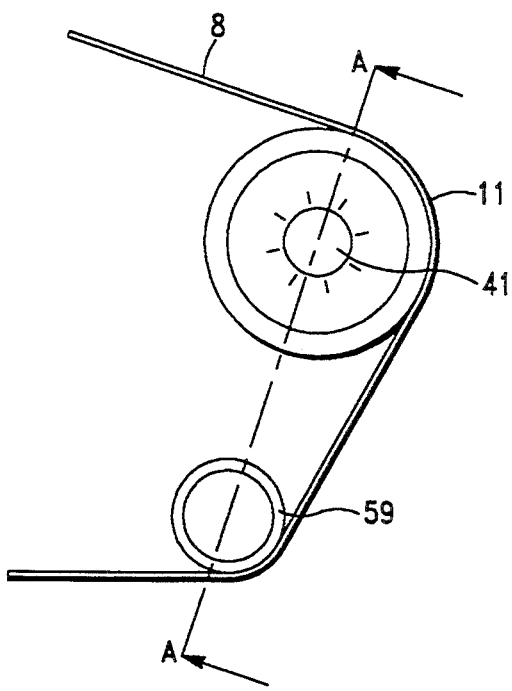
FIG.—13A
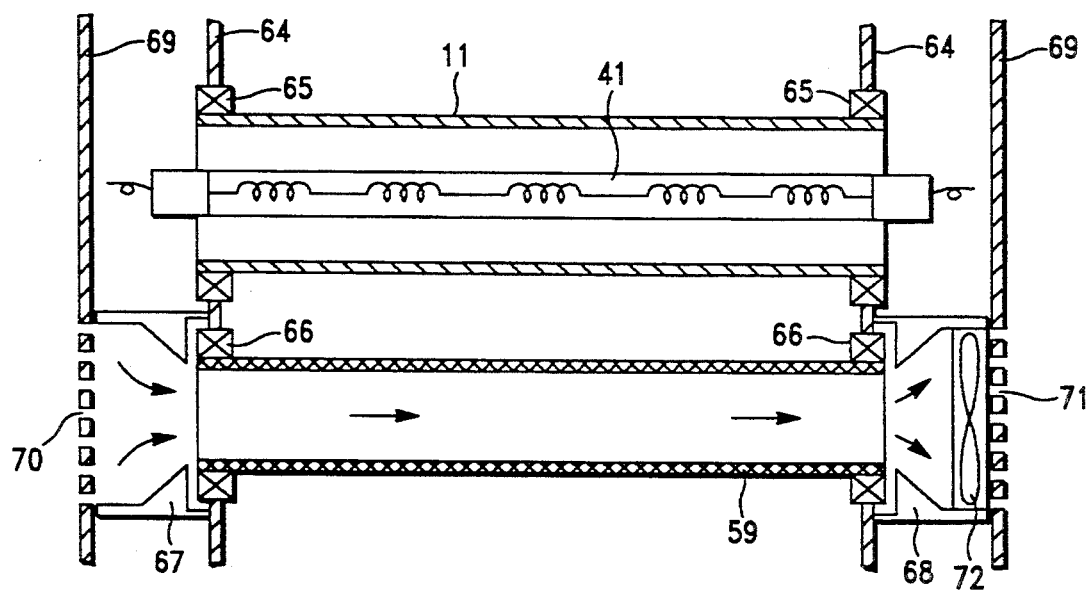
FIG.—13B
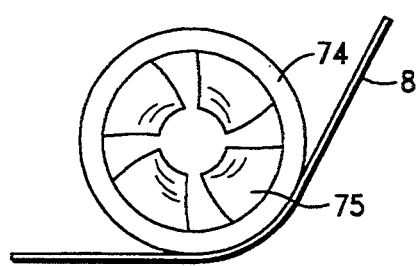
FIG.—14

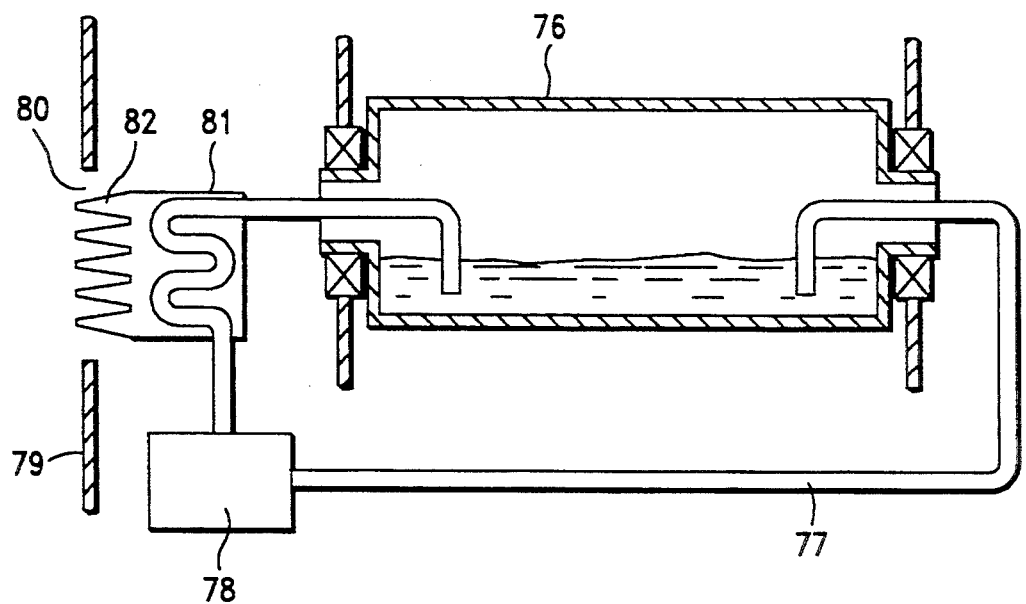
FIG.—17
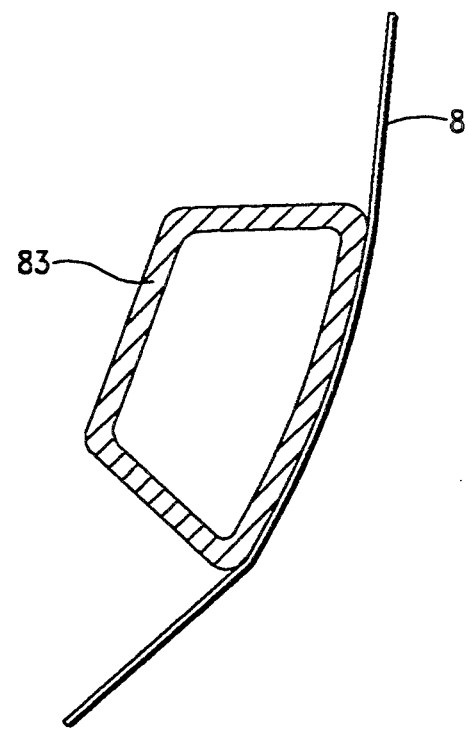
FIG.—18

IMAGE FORMING APPARATUS HAVING TEMPERATURE CONTROL FOR PHOTOSENSITIVE MEMBER

BACKGROUND OF THE INVENTION

1. Field of the Invention

The present invention relates to an image formation apparatus utilizing a heat developable transfer type photosensitive member to form images in a copying machine, printer, or the like. More particularly, it relates to control of the image formation process from heat development through pressure transfer.

2. Related Technical Art

Various kinds of methods and apparatus for forming images are known. A conventional image formation apparatus utilizing a heat developable transfer type photosensitive member is disclosed in, for example, Japanese Laid-Open patent No. 62-147461. According to that publication, main elements of the mechanism, such as exposure, heat development, and pressure transfer sections, are each arranged within a single structure for the apparatus. Image formation is then performed according to the following procedure.

A roll-type heat developable transfer-type photosensitive member is first cut into predetermined lengths before being exposed to an image in order to form a latent image. The heat development section next develops the latent image using heat rollers. Then, image-receiving paper is superposed with the photosensitive member, and is transferred by rollers under pressure. The photosensitive member is discharged by a separation device to a photosensitive member disposal section, while the image-receiving paper is discharged to a tray through a fixing device.

Such a prior art color copying machine, uses a photosensitive member with microcapsules including photosensitive materials, polymer compounds, and color materials, coated onto a supporting member, and a transfer member to receive color materials which are transferred from the photosensitive member under pressure. Development is performed in the heat developing section so that the entire contents of the microcapsule, including color materials, are transferred from the photosensitive member to the image receiving paper by the pressure transfer section, thereby copying images.

The above prior art has excellent characteristics in that it is possible to obtain a low-cost and small-sized image forming device, and produce high quality images. However, the prior art also has poor characteristics in that the environmental temperature and humidity of the photosensitive member moving from the heat developing section to the pressure transfer section, may be easily varied by the temperature of the image forming apparatus, which in turn may vary the hardness of the microcapsules, resulting in deterioration of image quality, that is, the image density becomes unstable. In particular, when the environmental temperature is high, the density decreases, and when the environmental temperature is low, the density increases.

Furthermore, other conditions are observed, for example, such as that density gradually decreases in response to increased elapsed time after powering-on. In addition, when an image is continuously output, the density of the output image varies and stable image quality cannot be obtained, and image quality may be further deteriorated, that is, the lowest density increases, or the highest density decreases.

In addition to the above, as another factor, the following situation was observed. Namely, that dispersion in densities increases according to a difference in the devices. The present invention seeks to eliminate the above problems, and its object is to provide an image formation apparatus wherein high quality images are output, that is, the rendering density is uniform and image quality is stable.

SUMMARY OF THE INVENTION

In an image forming apparatus of the present invention, wherein a photosensitive, heat developable, member is pressed together with a transfer member using a pressure transfer device, after heat development of the heat developable member by a heat developing device, the image formation apparatus comprises means for changing at least one of the temperature of the heat developing device and heating time, and means for detecting at least one of the temperature and humidity between the heat developing device and the pressure transfer device, wherein at least one of the temperature and heating time of the heat developing device is controlled according to data from the detecting means.

Otherwise, the image forming apparatus more specifically features means for controlling the temperature of the photosensitive member, provided between the heat developing device and the pressure transfer device, to achieve a uniform temperature, and in particular, a cooling means is provided between the heat developing device and the pressure transfer device, to maintain the photosensitive member below a predetermined temperature.

The inventors found that in the above two compositions, the latter, that is, the temperature of the photosensitive member from heat developing to pressure transfer, is highly effective for preventing deterioration of images. Hereinafter, this is described in detail.

Therefore, the image forming apparatus of the present invention specifically features cooling means for cooling the photosensitive member, after heat development, below the temperature of pressure transfer plus 50°-C. Otherwise, the image former apparatus of the present invention specifically features using the cooling means to start cooling the photosensitive member within 10 seconds after the photosensitive member is completely heated by the heat developing device.

The detailed structure of the cooling means is as follows. The cooling means is an air cooling type, and rotates in accordance with movement of the photosensitive member. It is desirable that the path for the cooling air be restricted so that cooling air does not affect air in the heating area. Otherwise, the cooling device may be a water type cooling device, and more specifically circulating cooling liquid in a hollow portion.

The photosensitive member used in the present invention is heat-developed after exposure, thereby hardening microcapsules in relation to the level of exposure, and a color agent is transferred to the transfer member by pressure to form images. As a result of earnest examination of a series of processes by the inventors, a continuation in the hardening of microcapsules is not only affected by the heat development treatment temperature and the heating time, but also by the temperature and humidity present from heat development through pressure transfer.

In general, there is an appropriate range with respect to the degree of hardness for the microcapsule. If the degree of hardness falls outside the appropriate range, some problems may occur, that is, the output image may be deteriorated. For example, the lowest density is very high, and the highest density is very low, and graduation may be poor, resulting in a color difference. FIG. 19 is a graph of changing heat development temperature $T_a$ for obtaining an appropriate proceeding of microcapsule hardness with respect to a temperature $T_b$ from heat development until pressure transfer, with uniform heating time.

In the graph, a plurality of curved lines are drawn according to the humidity from heat development up to pressure transfer. FIG. 20 is a graph of changing heating times for obtaining an appropriate proceeding of microcapsule hardness with respect to the temperature $T_b$ from heat development until pressure transfer. In the same manner as FIG. 19, a plurality of curved lines are drawn according to the humidity. The present invention, basically utilizes the relationship between them, controls the temperature of heat development, the heating time, and the temperature from heat development until pressure transfer, to obtain a stable image.

As a result of inventor examination of the above mentioned problems, it is understood that image deterioration may be greatly affected by a difference in the manner in which the temperature of the photosensitive member is lowered after heat development. In general, with respect to the heat developable photosensitive member, excellent rendering density may be obtained by only controlling the temperature during heat development within an appropriate range. Therefore, the heat developing device temperature is accurately controlled based on detected temperature from a temperature detector. In spite of this, if the temperature of the heat developing device was outside the appropriate range, an image of the rendering density was obtained. The inventors insight is that the heat developing reaction may continue to occur subsequent to the heat developing device, the temperature of the photosensitive member is continuously decreasing from the heat developing temperature, and further continues the reaction within the photosensitive member. As a result of experimental efforts, the inventors discovered that the degree of development may be greatly altered in response to decreasing persistent temperature after heat development. Therefore, the temperature of the photosensitive member differs in response to the surrounding temperature, the temperature of peripheral sections in the device, air flowing within the device, and so on, so that the rendering density is unstable.

When an image is output continuously, the pressure transfer device is heated by passage of the heated photosensitive member, so that an increasing temperature for the pressure transfer device developing is found. When the temperature of the pressure transfer device is changed, it is assumed that a material characteristic such as the viscosity of a microcapsule transferred from the photosensitive member to the transfer member also changes and that the density of a transferred image and image quality may be changed.

In the process of the above analysis, if a cooling means for cooling the heated photosensitive member in the heat developing device is provided, and the photosensitive member is cooled appropriately, even if the surrounding temperature is changed, stable and high quality images can be obtained, and the inventors confirmed that an increasing temperature for the pressure transfer device, as heated by continuous image output, is very small.

It is understood that these effects are obtained by the following. Namely, stable and uniform image transfer is performed by controlling any increasing temperature of the pressure transfer device, when the temperature of the photosensitive member carried to the pressure transfer device is a uniform temperature or less. Further, development is controlled within a predetermined range by controlling the temperature of the photosensitive member within a predetermined range along the photosensitive member transfer path after completion of heating by the developing device before the pressure transfer device, and further by shortening the heated path where development rapidly proceeds.

BRIEF DESCRIPTION OF THE DRAWINGS

FIGS. 5, 6, and 7 are each front cross-sectional views showing improvements for the first embodiment, and relate to several methods for controlling the heat developing time;

FIG. 8 is a front cross-sectional view showing a second embodiment according to the present invention;

FIGS. 13(a) and 13(b) are front cross-sectional and perspective views showing a detailed structure for the third embodiment;

FIGS. 14 to 17 are each cross-sectional views showing an improved third embodiment, with FIGS. 14 to 16 being air cooling type embodiments, and FIG. 17 a water cooling type embodiment;

FIG. 18 is a cross-sectional view of a cooling plate according to another embodiment for a cooling means.

BEST MODE OF CARRYING OUT THE INVENTION

The present invention is described below in detail in accordance with the embodiments.

Figure 1:
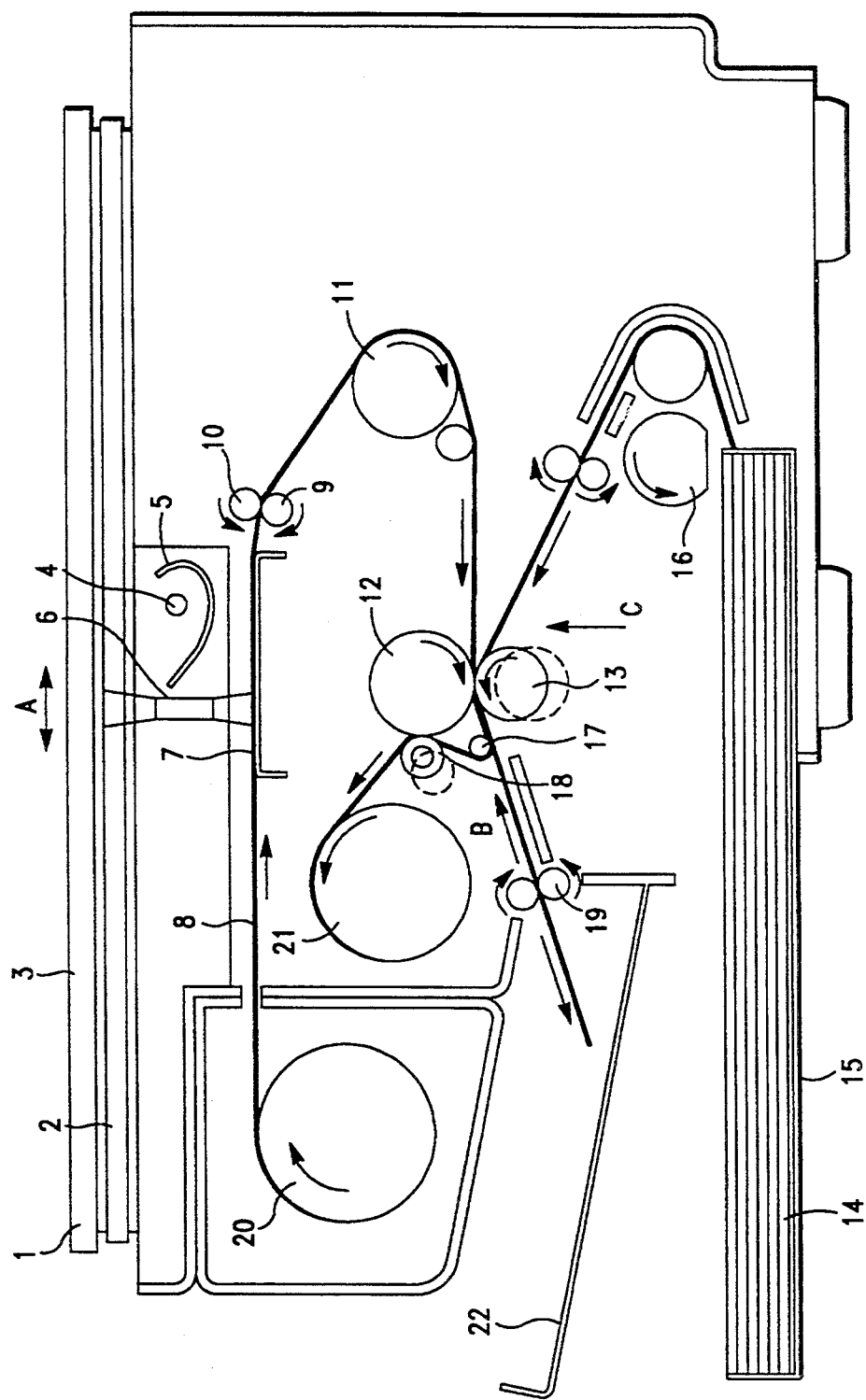
FIG. 1 is a front cross-sectional view showing a complete analog copying machine according to one embodiment of the present invention.

FIG. 1 is a front cross-sectional view of a complete structure, when the image formation apparatus of the present invention is used for an analog copying machine.

In FIG. 1, once a copying operation begins, a manuscript platen 2 onto which a manuscript 1 is placed and a manuscript cover 3 move to an exposure starting position on the left hand side of the figure. Scanning begins in a direction indicated by arrow A. At the same time, carrying rollers 9 and 10 rotate and an unused photosensitive member 8 is nippedly carried on and drawn from a supply roll 20, whereby photosensitive member 8 is carried synchronously with the scanning of the manuscript.

At this point, a light source 4 is lit and light gathered by a reflector 5 is irradiated onto manuscript 1 and then a latent image of manuscript 1 is formed through a lens 6 onto photosensitive member 8 on an exposure stand 7.

At substantially the same time the carrying operation for carrying rollers 9 and 10 begins, an upper transfer roller 12 rotates and a pinch roller 18 is moved in the direction of arrow B so as to be pressed toward upper transfer roller 12. Photosensitive member 8, on which the latent image is formed, is carried toward a heat developing device 11, so that the image is developed by contact heat between heat developing roller 11 and photosensitive member 8.

After heat development, as a front edge of the image recorded on the photosensitive member approaches near one roller of the pressure transfer device, that is, upper roller 12, a transfer member 14 is supplied from a supply tray 15 by a supply roller 16, and is superposed on the image area of the photosensitive member. Then, the other roller of the pressure transfer device, lower roller 13, is moved in the direction of arrow C, thereby pressing transfer member 14 and the photosensitive member between upper transfer roller 12 and lower transfer roller 13, so that the image on photosensitive member 8 is transferred to transfer member 14. After transfer, photosensitive member 8 is separated by a separation roller 17 from transfer member 14, and withdrawn onto a wind-up roll 21 using a pinch roller 18.

After completion of exposure scanning, light source 4 goes off and manuscript platen 2, onto which the manuscript is placed, and manuscript cover 3 are repositioned to the center position of the device.

When pressure transfer is completed at the end of the image, lower transfer roller 13 is moved toward a lower position. After that, carrying rollers 9 and 10 stop, and pinch roller 18 is also separated from upper transfer roller 12 and photosensitive member 8 stops moving. Transfer member 14, on which the pressure transfer is completed, is thereby discharged by discharge rollers 19 discharge tray 22, and a series of operations are completed.

A series of process steps from heat development through pressure transfer, that is, specific features of the present invention, are explained next. The structure for detecting temperature and humidity between heat development and pressure transfer, and for controlling the heat developing temperature is described in relationship to FIG. 2.

Figure 2:
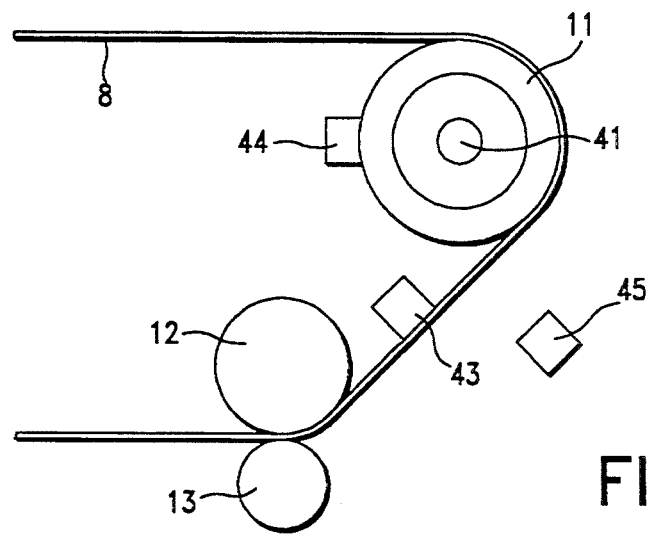
FIG. 2 is a front cross-sectional view showing one embodiment according to the present invention.

FIG. 2 is a front cross-sectional view near heat developing roller 11 and pressure transfer rollers 12 and 13. In this embodiment, a heater 41 formed inside a hollow heat developing roller 11, and a switch 42 for turning heater 41 on/off (not shown) are provided as a means of changing the temperature of the heat developing device. In this embodiment, a halogen lamp is used as a heater 41. For example, a nichrome wire extreme infrared radiation heater and switch for turning the heater on/off by the outer switch, can also be used. A thermistor 44 is slidably provided as a temperature detecting means, which monitors the surface temperature of heat developing roller 11. It is possible to omit thermistor 44, if heater power, on/off, and the temperature of the heat developing device are appropriately operated.

On the other hand, another temperature detecting means, thermistor 43, is provided which is placed in slidable contact with the rear surface of photosensitive member 8, to thereby detect the temperature between the heat developing device and the pressure transfer device. Besides a thermistor, a platinum temperature sensor, thermocouple, and so on can be used. If the distance between thermistor 43 and photosensitive member 8 is 50 mm or less, the thermistor may not be brought into contact with photosensitive member 8. If the thermistor 43 is provided at the rear surface of photosensitive member 8, there is no limitation for the distance between photosensitive member 8 and the thermistor. When thermistor 43 is provided on the front surface of photosensitive member 8, it is desirable that the distance between thermistor 43 and photosensitive member 8 be more than 0.5 mm and less than 5 mm, in order to avoid thermistor contact with capsules coated on the surface of the photosensitive member.

Humidity detecting means 45 is a changable impedance type humidity sensor using a high polymer thin film humidity sensitive material. Humidity detecting means 45 is not brought into contact with photosensitive member 8 and the distance between humidity detecting means 45 and photosensitive member 8 is within a fixed 50 mm. As an alternate humidity detecting means, a changable impedance type humidity sensor using ceramic humidity sensitive material, and static changable capacitance type humidity sensors can be used.

Figure 3:
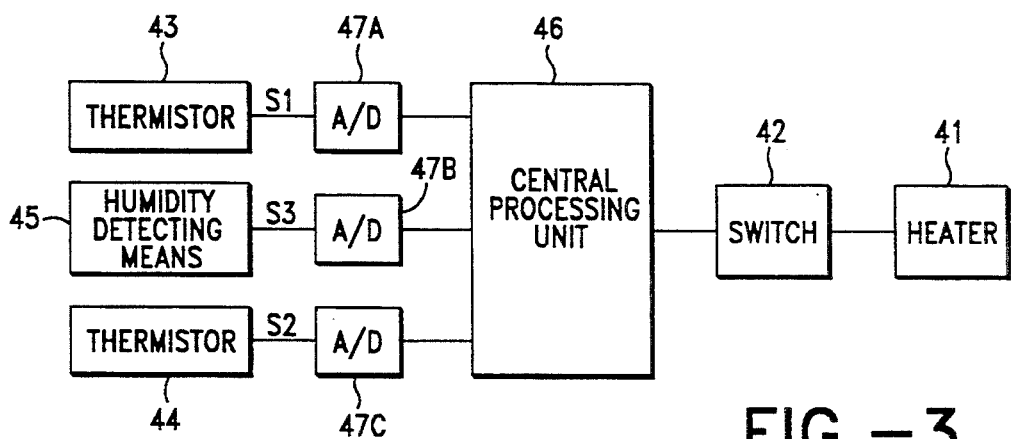
FIG. 3 is a block diagram showing a circuit for FIG. 2.
Figure 4:
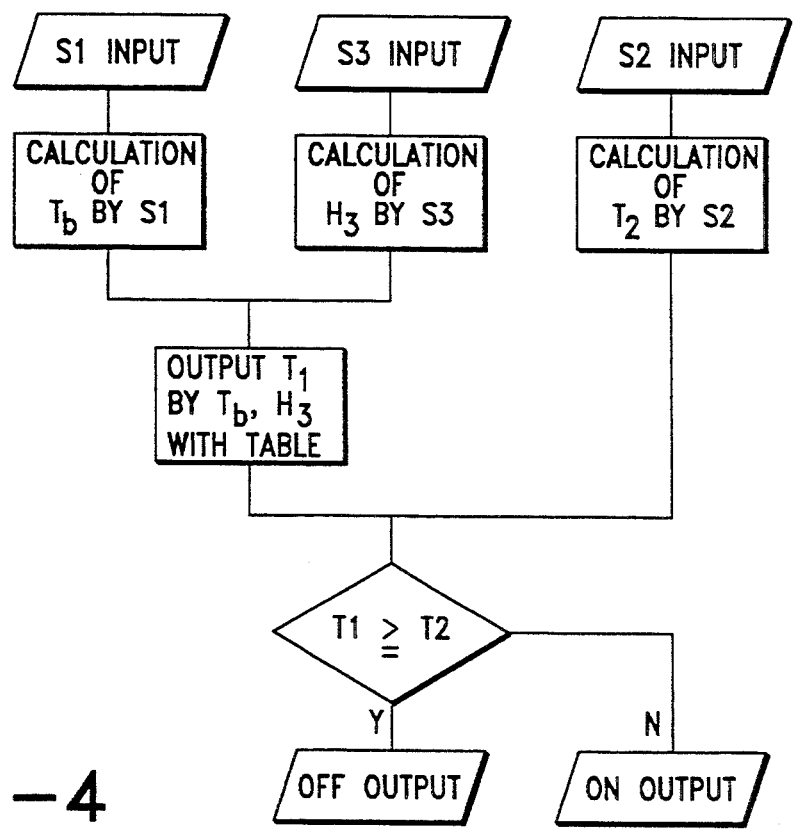
FIG. 4 is a view showing a processing method for the first embodiment.

FIG. 3 is a block diagram showing a circuit which changes the temperature of heat developing roller 11 using data from thermistor 43 and humidity detecting means 45. FIG. 4 is a flowchart showing processing flow for central processing unit 46. Thermistor 43 transmits a signal $S_1$, which is output according to the detected temperature, to central processing unit 46 through an A/D converter 47a, and humidity detecting means 45 transmits a signal $S_3$, which is output according to the detected humidity, to central processing unit 46 through an A/D converter 47b. Furthermore, thermistor 44 transmits a signal $S_2$, which is output according to the detected temperature, through an A/D converter 47c to central processing unit 46.

Central processing unit 46 calculates a temperature $T_b$ from $S_1$ from heat development until pressure transfer, and a humidity $H_3$ for the same period from $S_3$, and a desirable temperature $T_1$ for the heat developing roller is determined, in view of a specific relation stored in advance in an inside memory. Whether heater 41 turns on or off is determined next as a result of comparing temperatures $T_1$ and $T_2$ of the heat developing roller as calculated based on signal $S_2$ from thermistor 44. The on/off power state is determined according to the following method. Namely, as shown in FIG. 4, when $T_1 \leq T_2$, the heater is turned off and when $T_1 > T_2$, the heater is turned on.

Further, means for storing past temperature data, such as memory means, may also be provided in order to enable a more complex predictive control. Furthermore, besides a binary control over heater power switching, if multiple control values are used with duty cycle control, more accurate control such as controlling duty cycles according to differences between $T_1$ and $T_2$ can be conducted. It is possible that the dependency of the characteristic microcapsule hardness on humidity and temperature may be too low based on the kind of photosensitive member used. For such a photosensitive member, it goes without saying that it is possible to omit humidity detecting means 45 and thermistor 43.

Figure 5:
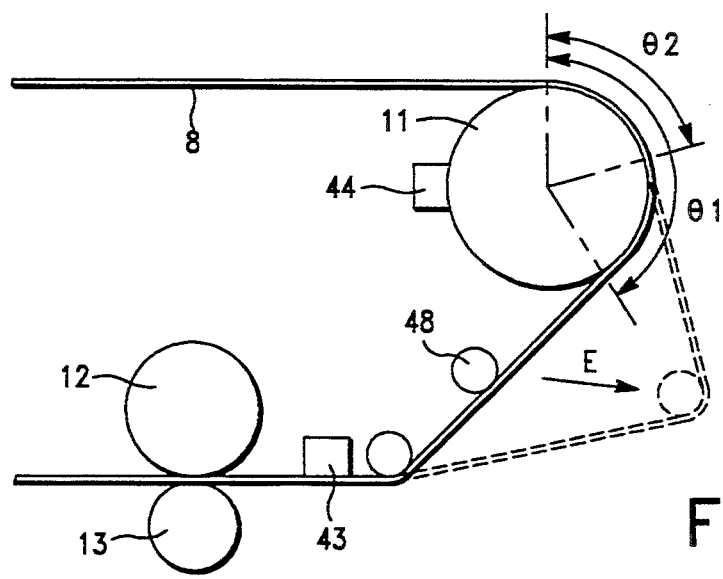
Figure 20:
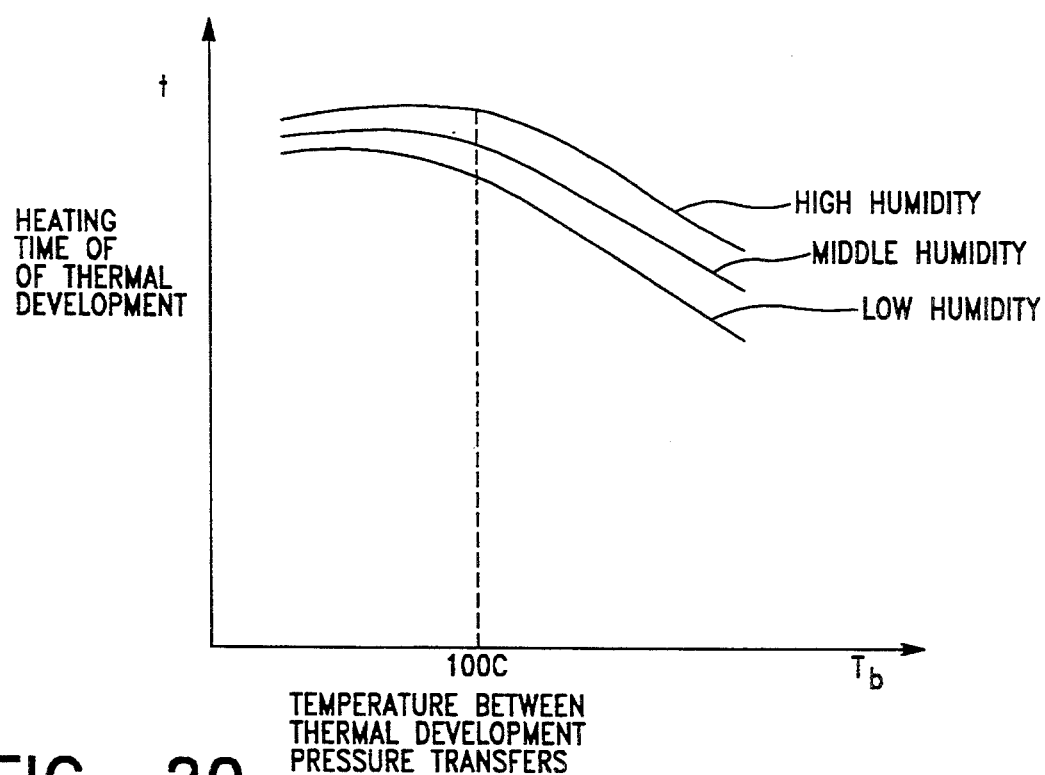

FIG. 5 shows an improvement in the first embodiment of FIG. 2, and is a front cross-sectional view near heat developing roller 11 and pressure transfer rollers 12 and 13. A specific feature of this embodiment is that the temperature between heat development and pressure transfer is detected in order to change the heating time of the heat developing device. A supplemental roller 48, which is slidably provided, fulfills this function. Thermistor 43 is provided as a temperature detecting means between heat development and pressure transfer in the same way as in the first embodiment. In this embodiment, supplemental roller 48 is moved toward the direction of arrow E in FIG. 5, and the angle $\theta$ between heat developing roller 11 and the winding portion of photosensitive member 8 is variable from $\theta_1$ to $\theta_2$, and, furthermore, the time of contact between heat developing roller 11 and photosensitive member 8 is variable. Since heat transfer from heat developing roller 11 to photosensitive member 8 does not generally occur during non-contact, the contact time may equal the heating time. As mentioned above, the heating time can be controlled by moving supplemental roller 48. Supplemental roller 48 can be moved to a proper position by a driving means such as a motor (not shown). The winding angle can be changed according to the temperature detected by thermistor 43 so that the photosensitive member can be heated for an appropriate time in view of the relation shown in FIG. 20. The heating time can be changed by other methods with the following being one embodiment.

Figure 6:
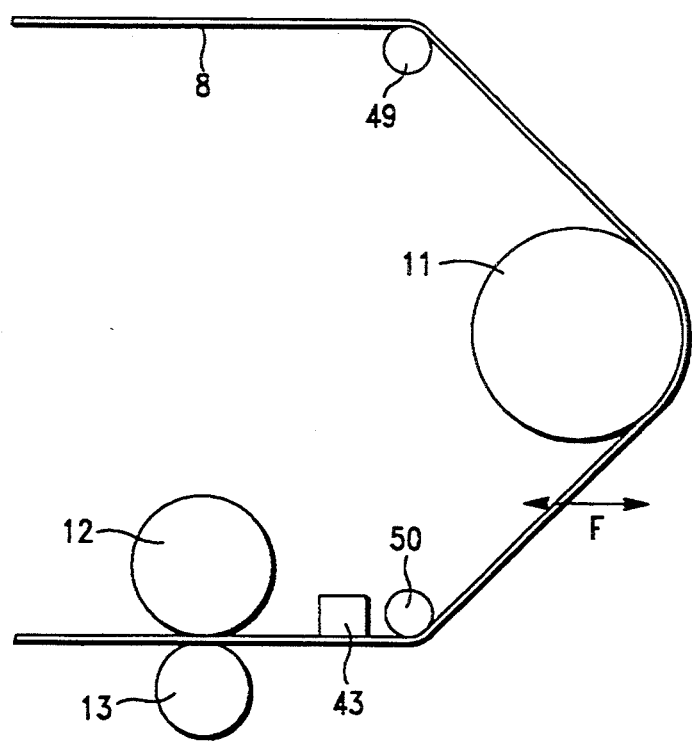

FIG. 6 is a front cross-sectional view showing another method for changing the heating time. Heat developing roller 11 is moved toward arrow F shown in FIG. 6 and against fixed supplemental rollers 49 and 50, thereby changing the winding angle and the heating time.

FIG. 7 shows a heat developing device employing a plate 51 having a heating section divided in two or more sections. Plate 51 has three heating sections a, b, and c. The heating time can be changed by switching power to respective divided heating sections. The number of divided sections powered is determined by a selected, desired, heating time period.

As mentioned above, the first embodiment is an embodiment for controlling the temperature of the heat development treatment and the heating time, respectively. It goes without saying that control of respective temperature and time ranges is narrowed by controlling both the temperature and the heating time, thereby simplifying control.

A second embodiment of the present invention is explained next. FIG. 8 is a front cross-sectional view showing the second embodiment. The second embodiment specifically features maintaining uniform temperature for the photosensitive member between heat development and pressure transfer.

In FIG. 8, a uniform temperature roller 52, which is a means for keeping the temperature of photosensitive member 8 uniform, is brought into contact with photosensitive member 8 between heat developing roller 11 and pressure transfer rollers 12 and 13. Uniform temperature roller 52 is made of a material having a large heat capacity, for example, steel. Further, a fan 53 is provided for cooling heat transferred from photosensitive member 8 to maintain a uniform temperature. Since the heat capacity of photosensitive member 8 is much smaller than that of uniform temperature roller 52, the temperature of photosensitive member 8 changes to the temperature of the uniform temperature roller, immediately after the heat developed photosensitive member 8 comes into contact with uniform temperature roller 52. In this embodiment, the temperature of uniform temperature roller 52 is not monitored. However, in order to be applicable to the larger environmental temperatures, a temperature detecting means such as a thermistor may also be provided for feedback control of the temperature. Furthermore, in this embodiment, although uniform temperature roller 52 is brought into contact with the rear surface of photosensitive member 8, uniform temperature roller 52 may also be brought into contact with the front surface of photosensitive member 8. In this case, the speed of roller rotation is arranged so as to match the speed of the photosensitive member movement, and it is desirable to not only simplify the transfer of heat but also prevent any damage which may be generated by friction between the surfaces of the photosensitive member and the roller. Furthermore, cushioning material may also be provided on the surface of the roller in order to enhance adhesion between the surfaces of the photosensitive member and the uniform temperature roller.

In addition, in the above second embodiment, the roller is used as a means for achieving uniform temperature, but a belt may also be provided besides the roller and the same effects can be obtained. In this case, the belt has a smaller heat capacity than that of the roller. Therefore, it is desirable to include a temperature detecting means for the belt to detect the temperature and cool the photosensitive member using a cooling fan until achieving a uniform temperature.

Figure 9:
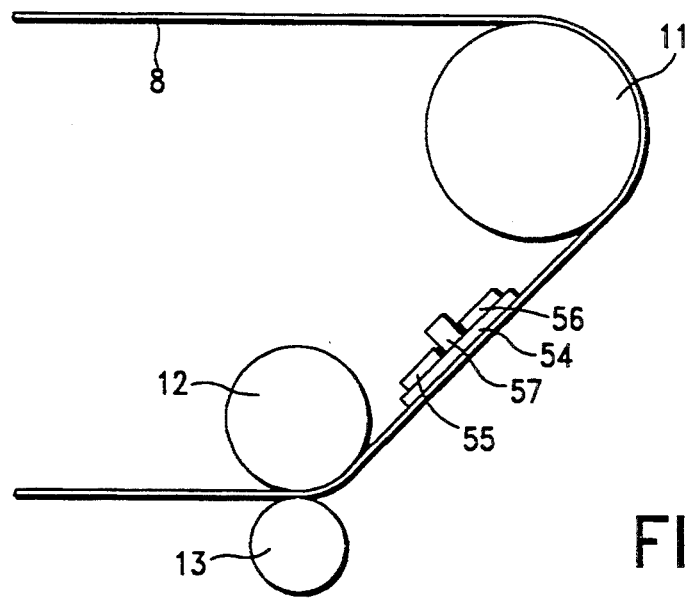
FIGS. 9 and 10 are front cross-sectional and perspective views, respectively, showing an improved second embodiment.

FIG. 9 is a front cross-sectional view showing an improvement in the second embodiment according to the present invention. A uniform temperature plate 54 is provided as a means for keeping the temperature of photosensitive member 8 uniform and is brought into contact with photosensitive member 8 on one or more surfaces. Photosensitive member 8 is transferred from the heat developing device and, then, comes in contact with uniform temperature plate 54 to keep the temperature of photosensitive member 8 uniform, and further reaches the pressure transfer device. A heating means 55, a cooling means 56, and a temperature detecting means 57 are all provided with uniform temperature plate 54. In this embodiment, an aluminum plate is used as a substrate. A heater, including a copper-nickel resistance element wound around a mica substrate, is used as heating means 55, and an electronic cooling element utilizing the Peltier effect is used as cooling means 56. A thermistor is used as temperature detecting means 57.

In addition to aluminum, other material may be used for mechanical members, for example, steel and plastic. Besides the above, a radiation heater such as a halogen lamp, or reverse polarity on the electronic cooling element utilizing the Peltier effect may also be used for heating means 55. In particular, when reverse polarity of an electronic cooling element is used, switching means for switching the normal/reverse polarities is added. The cooling means serves as a heater by switching the switching means, therefore such heating/cooling means is available for a low cost and in a small space. Besides the above electronic cooling element, a fan for injecting air may also be used.

The temperature of uniform temperature plate 54 is controlled by the heating/cooling means so as to be below the temperature of heat development, and to be a desirable temperature above 50° centigrade (C). In this embodiment, the surface of uniform temperature plate 54 in contact with photosensitive member 8 is plate-shaped, but the contact surface may also be curve-shaped such as a cylindrical surface. Further, in this embodiment, uniform temperature plate 54 is brought into contact with the rear surface of photosensitive member 8. If the material of uniform temperature plate 54 is made of very low friction material, the friction between the front surface of photosensitive member 8 and uniform temperature plate 54 may be made very low.

Uniform temperature plate 54 may also be spaced a little apart from the photosensitive member so that the distance between photosensitive member 8 and uniform temperature plate 54 is 10 mm or less. In this case, uniform temperature plate 54 may be provided opposite the front or rear surfaces of photosensitive member 8. Further, although not as effective for maintaining a uniform temperature, it is also possible to omit one of the heating and cooling means. Furthermore, in this embodiment, uniform temperature plate 54 is provided for one surface of photosensitive member 8, but uniform temperature plate 54 may also be provided for both surfaces.

Figure 10:
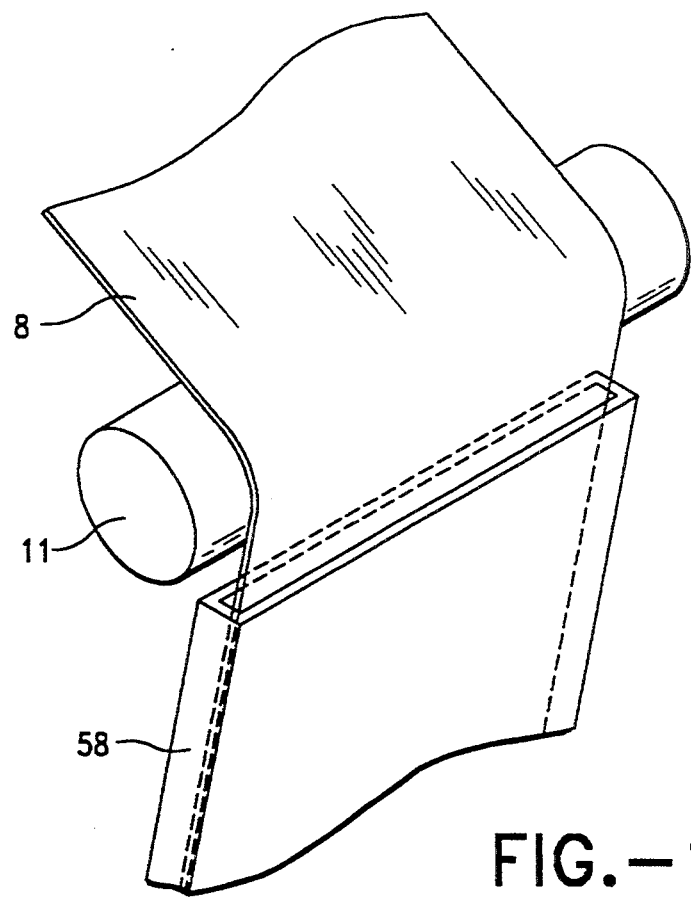

FIG. 10 is a perspective view of the improved embodiment where a path of motion for photosensitive member 8 is surrounded by a box 58, showing one embodiment for easily maintaining uniform temperature. Box 58 is generally made of a mechanical material such as iron substrate, thereby preventing the flow of air from reaching photosensitive member 8 in the device. Photosensitive member 8 is inserted into box 58 immediately after it is maintained at a uniform temperature by the heat developing device. The surface of box 58 opposite to photosensitive member 8 is separated from the photosensitive member by 0.5 mm to 50 mm, and the desirable distance between box 58 and the photosensitive member is more than 2 mm and less than 5 mm. Using such a separation, any surface damage of photosensitive member 8 is prevented. Further, box 58 may cover at least one of the peripheral surfaces of the photosensitive member, and it is not necessary to cover all of the surfaces.

Figure 11:
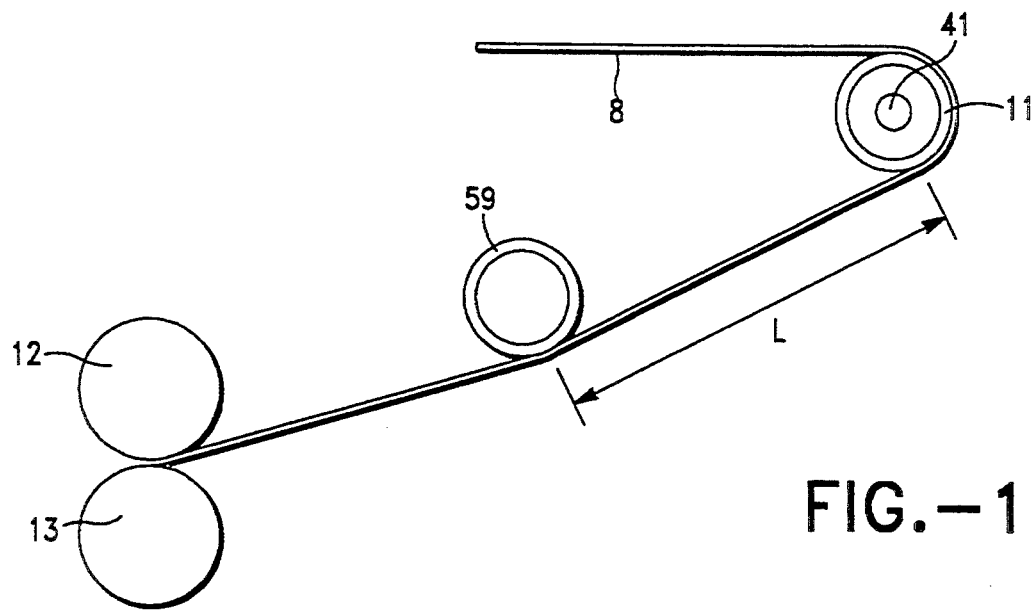
FIG. 11 is a front cross-sectional view showing a third embodiment according to the present invention.

A third embodiment of the present invention is explained next. A specific feature of this embodiment is that the photosensitive member from heat development until pressure transfer is cooled so as to be below the uniform temperature. FIG. 11 shows the basic structure of this embodiment, being a front cross-sectional view of heat developing roller 11, and pressure transfer rollers 12 and 13 of FIG. 1.

In this figure, the cooling of photosensitive member 8 is performed by bringing photosensitive member 8 into contact with a cooling roller 59 through a cooling device which comprises a pipe type cooling roller 59 inside of which air is selectively flowed. The hollow inside of cooling roller 59 is connected to air discharge ports, the ends of the air discharge ports include an air insert port and the cooling fan, respectively. The air flows inside cooling roller 59 by operation of the cooling fan, and cooling roller 59 is cooled, thereby cooling photosensitive member 8. A detailed structure is explained hereinafar.

It was described above that the photosensitive member temperature from heat development to pressure transfer causes deterioration of image quality in the image formation apparatus according to the present invention. Thereupon, the relation between the photosensitive member temperature from heat development to pressure transfer, and the image quality is described.

Figure 12:
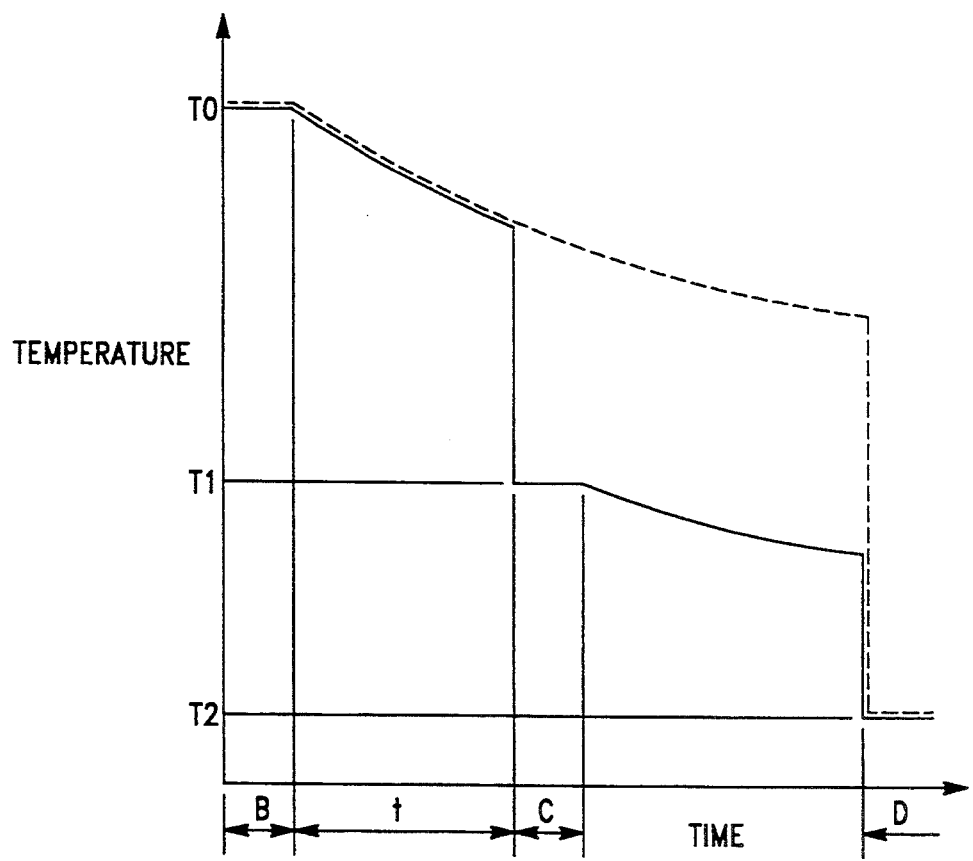
FIG. 12 is a conceptual view showing variations in temperature for the photosensitive member according to the third embodiment.

FIG. 12 is a conceptual view showing temperature variation for photosensitive member 8 according to the present invention. FIGS. 11 and 12 explain cooling conditions for the present invention.

In FIG. 11, the length L is a path length for movement of photosensitive member 8 from the heat developing roller to cooling roller 59. In FIG. 12, "t" is a time for movement of photosensitive member 8 from heat developing roller 11 to cooling roller 59. Further, a region B is that period in which photosensitive member 8 is brought into contact with heat developing roller 11 and is heated. A temperature $T_0$ is a temperature of the contact surface of heat developing roller 11. The region C is that time in which photosensitive member 8 is brought into contact with cooling roller 59 and is cooled. The temperature $T_1$ is a temperature of the contact surface of cooling roller 59. Region D is a time in which photosensitive member 8 is brought into contact with pressure transfer rollers 12 and 13. Temperature $T_2$ is a temperature of the contact surface of pressure transfer rollers 12 and 13.

In this embodiment, temperature $T_0$ of heat developing roller 11 is controlled so as to be approximately 150° C. for the reaction of development. Temperature $T_2$ of pressure transfer rollers 12 and 13 is controlled so as to be approxmately 60° C in order to stablilize the photosensitive member until reaching the transfer member and obtain good image quality. However, it is not necessary to limit the temperature to the above mentioned value. It is possible to select a heating temperature for heat development according to the shelf-life of the photosensitive member, developing speed, structure of the device, cost, and so on. It is possible to use a range of 100° to 180° C. On the contrary, it does not matter that the pressure transfer temperature is basically at room temperature. Since the viscosity of the microcapsule contents is lowered by heating, transfer is easily performed. It is desirable that the temperature is 30° to 100° C. in view of several conditions in addition to the heat development temperature. Namely, the pressure transfer device of the present invention is generally the same as a heat transfer device, although the pressure force and temperature differ from each other mechanically.

When there is no cooling roller 59, photosensitive member 8, which is heated by heat developing roller 11 to approximately 150° C., is cooled by the surrounding air and reaches pressure rollers 12 and 13. Such a condition is shown by broken lines in the conceptual view of FIG. 12. When there is a cooling roller 59, photosensitive member 8 is cooled by cooling roller 59 at temperature $T_1$ and the separations between heat developing roller 11 and cooling roller 59, and between cooling roller 59 and pressure transfer rollers 12 and 13 are cooled by the surrounding air.

The inventors experimented with copy image output, the experiments being divided into two categories, that is, one category being when no cooling roller 59 is used, as in the prior art, and the other being when the cooling capability of cooling roller 59 is altered by changing a voltage applied to the cooling fan which operates to flow air inside of cooling roller 59.

In the experimental method, the cooling temperature of cooling roller 59 was controlled by varying the force of air, and after that, the temperature of heat developing roller 11 was controlled a little so that a good image is obtained with an environmental temperature of 20° C. After that, the environmental temperature was changed and one hundred papers were continuously copied. The images and temperatures of pressure transfer rollers 12 and 13 after the first and hundredth paper were examined. Herein, the qualities of the images were functionally evaluated using four rankings: very good, substantially good, a little bad, and bad. The temperature of pressure transfer rollers 12 and 13 was set at 60° C. The speed of motion for photosensitive member 8 was 12 mm/second, the path length L was 60 mm, and the time of movement "t" between separation from heat developing roller 11 and reaching cooling roller 59 was 5 seconds. The results of this experimentation is shown below in Table 1.

TABLE 1

| Condition | Environmental Temperature | | | | |
|---|---|---|---|---|---|
| | 0° C. | 10° C. | 20° C. | 30° C. | 40° C. |
| No Cooling Roller | | | | | |
| one paper | 60° C. X | 60° C. Δ | 60° C. ● | 60° C. Δ | 60° C. X |
| one hundred papers | 88° C. X | 88° C. X | 89° C. X | 92° C. X | 91° C. X |
| Colling Roller 120° C. | | | | | |
| one paper | 60° C. Δ | 60° C. ○ | 60° C. ● | 60° C. ○ | 60° C. Δ |
| one hundred papers | 72° C. X | 71° C. X | 72° C. X | 71° C. X | 73° C. X |
| Cooling Roller 110° C. | | | | | |
| one paper | 60° C. ○ | 60° C. ● | 60° C. ● | 60° C. ● | 60° C. ○ |
| one hundred papers | 62° C. ○ | 62° C. ● | 62° C. ● | 61° C. ● | 63° C. ○ |
| Cooling Roller 100° C. | | | | | |
| one paper | 60° C. ● | 60° C. ● | 60° C. ● | 60° C. ● | 60° C. ● |
| one hundred papers | 60° C. ● | 61° C. ● | 61° C. ● | 60° C. ● | 62° C. ● |
| Cooling Roller 90° C. | | | | | |
| one paper | 60° C. ● | 60° C. ● | 60° C. ● | 60° C. ● | 60° C. ● |
| one hundred papers | 60° C. ● | 60° C. ● | 60° C. ● | 60° C. ● | 60° C. ● |

Result:
● : very good
Δ: a little bad
○: good
X: bad

Using Table 1, it is possible to reduce the elevated temperature of pressure transfer rollers 12 and 13 which may be caused by continuous image output, by sufficiently cooling, cooling roller 59. Further, it is possible to prevent deterioration of image quality, which may be caused by a continuous image output, by sufficiently cooling photosensitive member 8 with cooling roller 59. It is desirable that the temperature difference between photosensitive member 8 and pressure transfer rollers 12 and 13 be small, in order to prevent the temperature of pressure transfer rollers 12 and 13 from rising. As shown in Table 1, if the temperature of cooing roller 59 is less than the temperature of pressure transfer rollers 12 and 13 plus 50° C., that is, less than 110° C., the increase in temperature for pressure transfer rollers 12 and 13 is small enough and available. Further, if the temperature of cooling roller 59 is less than the temperature of pressure transfer rollers 12 and 13 plus 30° C., that is, below 90° C., the increase in temperature of pressure transfer rollers 12 and 13 is insignificant, and is very available.

Further, by cooling cooling roller 59, the range in which a good image can be obtained becomes larger in spite of changes in the environmental temperature. Namely, in Table 1, with respect to the first image output where increasing temperature for pressure transfer rollers 12 and 13 can be neglected, when there is no cooling roller 59, the image is a little poor for a temperature of 10° C. or 30° C. On the other hand, when cooling roller 59 is used, the range where a good image quality can be obtained is very broad, when the temperature of cooling roller 59 is low. As shown in FIG. 12, a conceptual view showing temperature variation when cooling is performed, the effect of the cooling air temperature on the photosensitive member in transition between heat developing roller 11 and pressure transfer rollers 12 and 13 decreases, and since the path of photosensitive member 8, which is maintained at a high temperature, is short, the heat developing reaction decreases.

Further, the inventors experimentally examined the range of the above effects, that is, the mounting position of cooling roller 59 was changed. The time of movement between when photosensitive member 8 is separated from heat developing roller 11 and when it comes into contact with cooling roller 59 was changed and images were copied under respective environmental temperatures. Namely, the speed of photosensitive member 8 movement was 12 mm/second and the path length L was changed from 24 mm to 180 mm and the time of motion "t" from heat developing roller 11 to cooling roller 59 was changed from 2 to 15 seconds. The cooling temperature of the photosensitive member was 110° C. by cooling roller 59. The experimental results are shown in Table 2.

TABLE 2

| | Image by Environmental Temperature | | | | |
|---|---|---|---|---|---|
| | Environmental Temperature | | | | |
| Condition | 0° C. | 10° C. | 20° C. | 30° C. | 40° C. |
| Colling Roller 110° C. | | | | | |
| t = 2 | | | | | |
| t = 3 | | | | | |
| t = 4 | | | | | ○ |
| t = 5 | ○ | | | | ○ |
| t = 6 | ○ | | | ○ | Δ |
| t = 7 | Δ | | | ○ | Δ |
| t = 8 | Δ | | | ○ | Δ |
| t = 10 | Δ | ○ | | ○ | X |
| t = 12 | Δ | ○ | | Δ | X |
| t = 15 | X | Δ | | Δ | X |

Result:
● : very good
Δ: a little bad
○: good
X: bad

As shown in Table 2, as time t for movement from heat developing roller 11 to cooling roller 59 decreases, variations in the image decrease according to a change in the environment. As shown in Table 2, it is desirable that time t be less than 10 seconds in order to prevent poor images for temperatures of 10° to 30° C. which is the general environmental temperature. Further, it is more desirable that time t be less than or equal to 5 seconds to obtain good images. Further, if time t is less than 3 seconds, it is possible to obtain good images not only under a typical environmental temperature but also in the range from 0° C. to 40° C. Using such a configuration, it is possible to obtain stable heat development for a uniform image density in spite of the variability in conditions of use. As a result, the heat developing reaction speed is highly temperature dependent and if the photosensitive member is sufficiently cooled, the reaction stops and image conditions are not changed along the path where the temperature of the photosensitive member is not accurately controlled after the heat developing reaction. Therefore, it is possible to maintain the accurately controlled conditions achieved in the image heat development section until commencement of the pressure transfer process.

With respect to the above mentioned cooling means, a derailed configuration is explained next.

First, an air cooling type cooling means is described. FIG. 13(a) is a front cross-sectional view of a peripheral portion of the cooling means and the heat developing device according to the third embodiment of FIG. 11. FIG. 13(b) is a cross sectional view along A—A of FIG. 13(a).

In the figure, photosensitive member 8 rotates around heat developing roller 11 by a predetermined amount, and is carried under tension and heated from the surface where microcapsules are not coated. Heat developing roller 11 is rotatably supported by first bearings 65 attached to a frame 64 at both ends thereof. Further, heat developing roller 11 has a heater 41 within the cylinder thereof to appropriately control the amount of heat so that a predetermined temperature is provided. Cooling roller 59 is a pipe made of aluminum and is rotatably attached to frame 64 through a second bearing 66. During copying, when photosensitive member 8 is carried, the frictional force between photosensitive member 8 and the surface of cooling roller 59 is stronger than the resistance to rotation of cooling roller 59, so that cooling roller 59 is moved together with photosensitive member 8 without any slippage. A first duct 67 and a second duct 68 are attached to the frame 64 so as to oppose openings 70 and 71 of outer case 69. There is a channel extending between openings 70 and 71, and cooling air flows toward the direction of the arrow, as shown in the figure. A fan 72 is attached to second duct 68 and fins of fan 72 are rotatably driven by a motor mounted therein. Duct 68 is substantially cone shaped so that resistance to air flow decreases to as small a value as possible between cooling roller 59 and fan 72.

Cooling roller 59 must be maintained below 110° C., and as desired, cooling roller 59 may be maintained below 90° C. In order to obtain this temperature, if a typical device size and a desirable cost fan 72 are used, the inner diameter of cooling roller 59 is desirably 5 mm or more. Fan 72 may continuously rotate. In order to reduce noise, fan 72 may rotate during copying only. The temperature of cooling roller 59 increases until it reaches a temperature where photosensitive member 8 cannot be cooled to less than the temperature of copying, because photosensitive member 8, which is heated by heat development, is brought into contact with cooling roller 59 and heat is transferred to cooling roller 59 by the heated photosensitive member. While heat is not transferred to cooling roller 59 from the heated photosensitive member in a stand-by condition.

Furthermore, in order to reduce situations where the fan rotates, a temperature sensor for detecting the temperature of cooling roller 59 may be provided for rotating fan 72 based on detected temperature.

In this embodiment, cooling roller 59 is constructed so that cooling air does not flow in other sections inside the device body, therefore, heat development temperature stability is not impaired and stable output image density can be obtained.

More still, since the photosensitive member, which is heated by heat development, continuously passes a cooling surface, it is required to radiate heat effectively. As mentioned above, if heat is radiated from the cooling device by effective air flow, it is possible to have a photosensitive transfer type image formation apparatus which features small size and cost.

An improved embodiment of FIG. 13 is explained next in relation to the front cross-sectional view of FIG. 14. In this embodiment, besides the fan, cooling air is generated by a plurality of blades 75 provided inside of cooling roller 74. Cooling roller 74 is a pipe made of aluminum and is rotatably attached to a frame (not shown) using a bearing (not shown) in the same manner as that of the above mentioned embodiment.

When photosensitive member 8 is carried during copying operations, the frictional force exerted between photosensitive member 8 and the surface of cooling roller 74 is stronger than the rotating resistance of cooling roller 74, and cooling roller 74 is moved together with photosensitive member 8 without any slippage. Using this rotation, a plurality of blades 75 allow air to flow inside cooling roller 74 so as to remove heat from cooling roller 74 and radiate the heat outside. If a plurality of blades 75 are attached to a member other than cooling roller 74, and the rotation of cooling roller 74 is increased using a gear or the like to rotate blades 75, the cooling efficiency is very high.

For a cooling method, several kinds of methods other than the method mentioned above may be used. As an alternate air cooling type means, one embodiment is described in brief.

Figure 15:
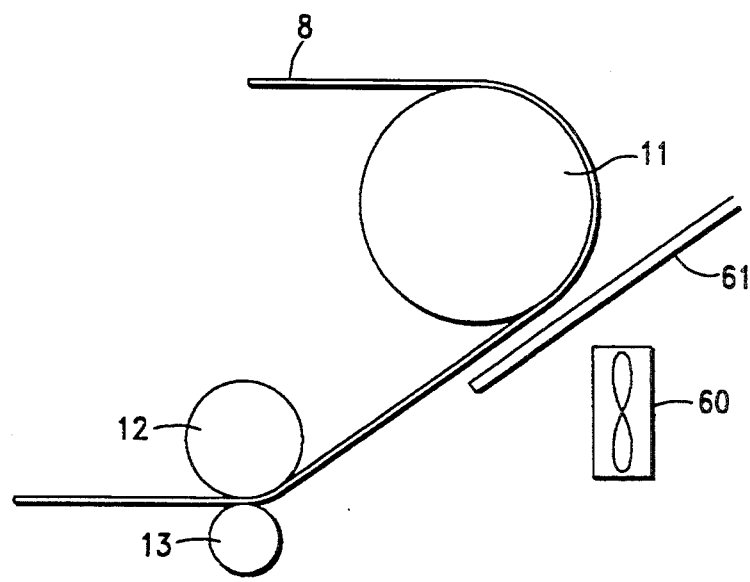

FIG. 15 is a front cross-sectional view showing an improved third embodiment of FIG. 11.

In the drawing, with respect to fan 60, which is a cooling means provided between the heat developing device and the pressure transfer device, air blows directly against photosensitive member 8, thereby maintaining the temperature of photosensitive member 8 under 100° C. in a moment. A shielding plate 61 is provided between fan 60 and the heat developing device to prevent air transmitted from the fan from blowing directly on the heat developing device. In this manner, it is possible to prevent the heat developing device from being unnecessarily cooled.

Figure 16:
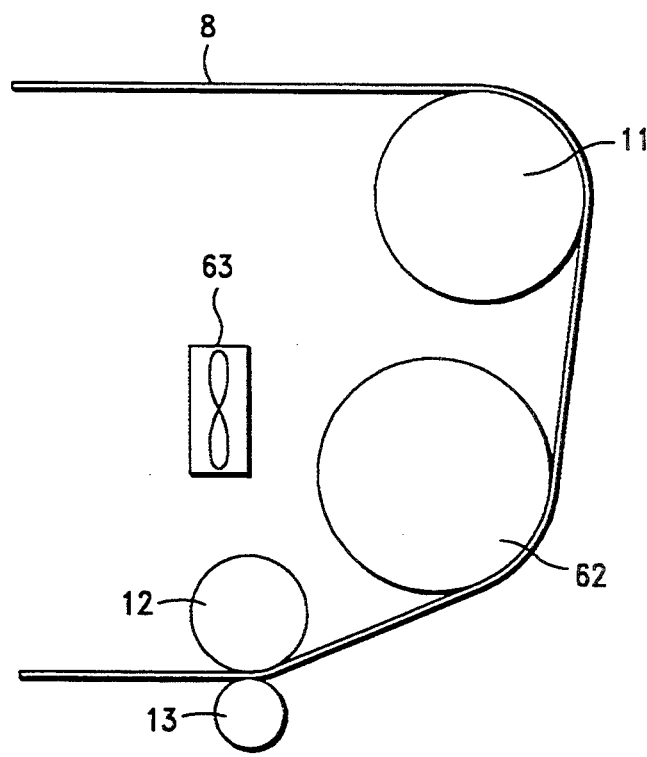
Figure 19:
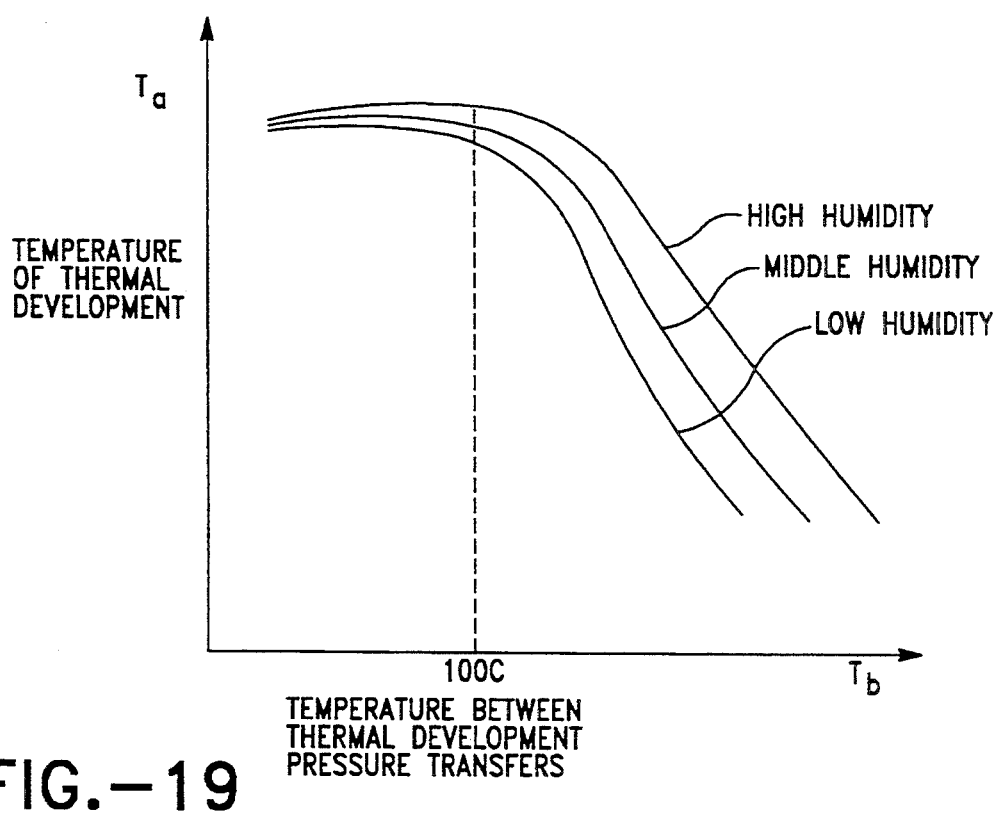
FIGS. 19 and 20 are conceptual views showing specific features of a photosensitive member which is useful in the present invention.

FIG. 16 is another improved embodiment, and in this embodiment a heat removing roller 62 is used as a cooling means. This embodiment has substantially the same construction as that of the second embodiment mentioned above, but the roller temperature is forcibly cooled by fan 63 so as to decrease below a predetermined temperature.

An improved embodiment of the third embodiment of the image formation apparatus according to the present invention is explained next in relation to the front cross-sectional view of FIG. 17. In this embodiment, a water cooling means is used as a means to circulate a cooled liquid and to cool cooling roller 76.

In the figure, a pump 78 is connected to a pipe 77 in a channel, and a radiator 81 is provided near an opening 80 of the outer case 79. With respect to pump 78, a flow amount may be approximately 0.1 cc/sec. or more, although it may depend on the level of the cooled temperature. A gear pump, a reciprocating pump, or the like is used. Radiator 81 has a channel comprising a block made of aluminum so that liquid may be brought into contact with radiator 81 for an extended time, and radiator 81 also has a plurality of fins 82 so that the surface area touching the outside air may be as large as possible. In this embodiment, the cooling rate of radiator 81 is accelerated by natural convection of the air, but the radiator may also be forcibly cooled by a cooling fan. Further, a cooling liquid is forcibly circulated by pump 78, but may also be circulated using natural convection.

In this embodiment, cooling roller 76 is rotated in response to the movement of photosensitive member 8 in the same manner as in the embodiment mentioned above. Since pipe 77 is fixed, it is impossible to secure cooling roller to pipe 77. Therefore, it is difficult to seal the cooling liquid inside the channel. In this embodiment, such a problem is eliminated by rotating cooling roller 76. Namely, as shown in FIG. 17, the cooling liquid is injected in an appropriate amount so that the liquid does not overflow the opening of cooling roller 76.

Most portions of the channel are positioned under the liquid surface of cooling roller 76, therefore there is no leakage of the cooled liquid. Further, the cooled liquid is brought into contact with the entire inside surface of the cooling roller by rotating cooling roller 76, therefore, the cooling efficiency is the same as the case where the cooling liquid fills the channel.

Using such a construction, it is possible to cool the photosensitive member simply by circulating a cooling liquid. In this case, temperature stability of heat development is not hindered.

Further, in the above mentioned embodiment, the cooling means is rotated with the movement of the photosensitive member. However, besides that embodiment, a method for bringing photosensitive member 8 in contact with the cooling means may also be used in order to stabilize the image density. In this case, it is not necessary that the portion corresponding to the cooling roller be a cylindrical shape, and in general, a hollow shaped member may be used. FIG. 18 shows a cross-sectional view of a cooling means in one embodiment. In that embodiment, the photosensitive member is slidably brought into contact with the top surface of cooling plate 83, and cooling air flows in a hollow portion in the same manner as that of the above mentioned embodiment. Of course, cooling liquid may also be circulated.

Further, in the above mentioned second and third embodiments, only temperature control is explained, because it is recognized that the affect of temperature is very large. In addition, as shown in the first embodiment, the control of humidity may also be added. Although the control mechanism is a little complex, more accurate control can be performed, and more stable image quality can be obtained and of course, as will be appreciated by one of ordinary skill in the art, shielding plate 61 could be incorporated into the first and second embodiments.

Furthermore, the present invention is applicable to all heat developable photosensitive members, and is not limited to the photosensitive transfer type heat developable material described in these embodiments.

More still, in these embodiments, a copying machine is examined as one embodiment, but the present invention is not limited to a copying machine, and it is needless to say that it is applicable to image formation apparatus in general, such as printers, facsimile machines, and electronic cameras.

Industrial Applicability

As mentioned above, the present invention is broadly applicable to processing devices utilizing a heat developable photosensitive member. In particular, the present invention is usable for an image formation apparatus such as a copying machine, printer, facsimile machine, electronic camera, and so on. The pressure transfer is performed under a low temperature after heat development under a high temperature.

Further, it is possible to construct an image formation apparatus having a uniform image density and high quality image output without variation in the environmental temperature or the conditions of use for the device. Furthermore, with the structure for controlling heat development temperature and heating time, the temperature differences between the respective members and the heat developing device can be compensated for, and the cost of the device reduced.

While the invention has been described in conjunction with several specific embodiments, it is evident to those skilled in the art that many further alternatives, modifications and variations will be apparent in light of the forgoing description. Thus, the invention described herein is intended to embrace all such alternatives, modifications, applications and variations as may fall within the spirit and scope of the appended claims.

| APPENDIX | |
|---|---|
| Description of the reference numerals | |
| 1 Manuscript | 50 Supplemental roller |
| 2 Manuscript platen | 51 Plate |
| 3 Manuscript Cover | 52 Uniform temperature roller |
| 4 Lamp | 53 Fan |
| 5 Reflector | 60 Fan |
| 6 Lens | 63 Fan |
| 7 Exposure stand | 72 Fan |
| 8 Photosensitive member | 54 Uniform temperature plate |
| 9 Carrying roller | 55 Heating means |
| 10 Carrying roller | 56 Cooling means |
| 11 Heat developing roller | 57 Temperature detecting means |
| 12 Upper transfer roller | 58 Box |
| 13 Lower transfer roller | 59 Cooling roller |
| 14 Transfer member | 74 Cooling roller |
| 15 Paper supply tray | 76 Cooling roller |
| 16 Paper supply roller | 61 Shielding plate |
| 17 Separate roller | 62 Heat removing roller |
| 18 Pinch roller | 64 Frame |
| 19 Discharge roller | 65 First bearing |
| 20 Supply roll | 66 Second bearing |
| 21 Wind-up roll | 67 First air duct |
| 22 Discharge tray | 68 Second air duct |
| 41 Heater | 69 Outer case |
| 42 Switch | 79 Outer case |
| 43 Thermistor | 70 Opening |
| 44 Thermistor | 71 Opening |
| 45 Humidity detecting means | 80 Opening |
| 46 Central possessing unit (CPU) | 75 Blade |
| 47a A/D converter | 77 Pipe |
| 47b A/D converter | 78 Pump |
| 47c A/D converter | 81 Radiator |
| 48 Supplemental roller | 82 Fin |
| 49 Supplemental roller | 83 Cooling plate |

What is claimed is:

1. An image formation apparatus in which a photosensitive member is pressed together with a transfer member by a pressure transfer device after the photosensitive member, on which an image was exposed, is heat developed by a heat developing device, the image formation apparatus comprising:

means for changing at least one of a temperature and a heating time of said heat developing device; and detecting means for detecting at least one of a temperature and a humidity between said heat developing device and said pressure transfer device, and wherein at least one of the temperature and the heating time of said heat developing device is controlled by data generated from said detecting means.

2. The image formation apparatus claimed in claim 1, wherein an angle of contact between said photosensitive member and a heat developing roller is controlled so as to change the heating time.

3. The image formation apparatus claimed in claim 1, wherein the heat developing device comprises a heating area divided into plural portions.

4. An image formation apparatus in which a photosensitive member is pressed together with a transfer member by a pressure transfer device after the photosensitive member, on which an image was exposed, is heat developed by a heat developing device, the image formation apparatus comprising:

a cooling means for keeping a temperature of said photosensitive member uniform and below a predetermined temperature is disposed between said heat developing device and said pressure transfer device, wherein said cooling means cools the photosensitive member heated by the heat developing device to less than a temperature of the pressure transfer device plus 50° C.; and wherein said cooling means comprises a hollow type member and a fan to flow cooling air through the hollow member;

a member to substantially inhibit cooling air from said cooling means from flowing against air near a heating portion of said heat developing device.

5. The image formation apparatus claimed in claim 4, wherein the cooling air flows only during the image forming operation.

* * * * *

UNITED STATES PATENT AND TRADEMARK OFFICE
CERTIFICATE OF CORRECTION

PATENT NO. : 5,414,488
DATED : May 9, 1995
INVENTOR(S) : Fujita et al.

It is certified that error appears in the above-indentified patent and that said Letters Patent is hereby corrected as shown below:

On the title page, item [75], change "Mimose" to --Momose--.

Signed and Sealed this

Twenty-first Day of November, 1995

Attest:

BRUCE LEHMAN

*Attesting Officer*   *Commissioner of Patents and Trademarks*